(12) United States Patent
Zhu et al.

(10) Patent No.: US 11,354,927 B2
(45) Date of Patent: Jun. 7, 2022

(54) FINGERPRINT IDENTIFICATION DEVICE, DISPLAY PANEL AND FABRICATION METHOD THEREOF, AND DISPLAY DEVICE

(71) Applicant: BOE TECHNOLOGY GROUP CO., LTD., Beijing (CN)

(72) Inventors: Jianchao Zhu, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 445 days.

(21) Appl. No.: 16/472,438

(22) PCT Filed: Dec. 6, 2018

(86) PCT No.: PCT/CN2018/119609
§ 371 (c)(1),
(2) Date: Jun. 21, 2019

(87) PCT Pub. No.: WO2019/205646
PCT Pub. Date: Oct. 31, 2019

(65) Prior Publication Data
US 2021/0406501 A1    Dec. 30, 2021

(30) Foreign Application Priority Data
Apr. 24, 2018  (CN) .......................... 201810374984.8

(51) Int. Cl.
*G06K 9/00*      (2022.01)
*G06V 40/13*     (2022.01)
(Continued)

(52) U.S. Cl.
CPC ........ *G06V 40/1318* (2022.01); *G06V 10/147* (2022.01); *G06V 40/13* (2022.01);
(Continued)

(58) Field of Classification Search
CPC .. G06K 9/0004; G06K 9/209; H01L 27/3234; H01L 27/3246; H01L 27/3272; H01L 51/56; H01L 2227/323; G06F 3/044
See application file for complete search history.

(56) References Cited

U.S. PATENT DOCUMENTS

2017/0161543 A1* 6/2017 Smith .................. G06K 9/0004
2018/0101039 A1   4/2018 Lin et al.
(Continued)

FOREIGN PATENT DOCUMENTS

CN    106324906 A    1/2017
CN    106773219 A    5/2017
(Continued)

OTHER PUBLICATIONS

International Search Report and Written Opinion in corresponding International Patent Application No. PCT/CN2018/119609 dated Feb. 27, 2019 (an English translation attached hereto). 14 pages.

*Primary Examiner* — Abdul-Samad A Adediran
(74) *Attorney, Agent, or Firm* — Leason Ellis LLP

(57) ABSTRACT

A fingerprint identification device, a display panel, a fabrication method thereof, and a display device are disclosed. The fingerprint identification device includes a fingerprint sensor, an aperture diaphragm, and a first shielding structure. The fingerprint sensor includes a plurality of sensing units; the aperture diaphragm is on a light incident side of the fingerprint sensor and includes an aperture through which light is allowed to be incident on at least one sensing unit of the fingerprint sensor; and the first shielding structure is on a side of the aperture diaphragm facing away from the fingerprint sensor, and surrounds at least a portion of the aperture.

17 Claims, 12 Drawing Sheets

(51) Int. Cl.
   *G06V 10/147*  (2022.01)
   *H01L 27/32*   (2006.01)
   *H01L 51/56*   (2006.01)

(52) U.S. Cl.
   CPC ...... *H01L 27/3234* (2013.01); *H01L 27/3246* (2013.01); *H01L 27/3272* (2013.01); *H01L 51/56* (2013.01); *H01L 2227/323* (2013.01)

(56) References Cited

U.S. PATENT DOCUMENTS

2019/0056613 A1    2/2019  Wang et al.
2019/0156093 A1*   5/2019  Kim ........................ G06F 3/044

FOREIGN PATENT DOCUMENTS

| CN | 107451576 A | 12/2017 |
| CN | 107689384 A | 2/2018  |
| CN | 108596096 A | 9/2018  |

* cited by examiner

FINGERPRINT IDENTIFICATION DEVICE, DISPLAY PANEL AND FABRICATION METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2018/119609, filed Dec. 6, 2018, which claims priority to Chinese Patent Application No. 201810374984.8, entitled "Fingerprint Identification Device, Display Panel and Fabrication Method thereof, and Display Device" and filed on Apr. 24, 2018, the disclosures of which are incorporated herein by reference in their entireties as part of the present application.

TECHNICAL FIELD

At least one embodiment of the present disclosure relates to a fingerprint identification device, a display panel, a fabrication method of the display panel, and a display device.

BACKGROUND

At present, most of fingerprint identification positions of electronic products such as mobile phones are in non-display regions, for example, keys for fingerprint identification are separately set in the non-display region. A solution of implanting fingerprint sensing in a display region will bring better user experience, so integrating a fingerprint identification function into the display region is a current technological trend. There are mainly three modes of implementing fingerprint identification at present, which are respectively optical fingerprint identification, capacitive fingerprint identification, and radio frequency fingerprint identification.

SUMMARY

At least an embodiment of the present disclosure provides a fingerprint identification device. The fingerprint identification device comprises: a fingerprint sensor, comprising a plurality of sensing units; an aperture diaphragm on a light incident side of the fingerprint sensor, the aperture diaphragm comprising an aperture, the aperture being configured to allow light to be incident on at least one sensing unit of the fingerprint sensor through the aperture; and a first shielding structure on a side of the aperture diaphragm facing away from the fingerprint sensor, the first shielding structure being configured to surround at least a portion of the aperture.

For example, in the fingerprint identification device provided by an embodiment of the present disclosure, the first shielding structure is configured to be light transmissive and comprises a first opening, the first opening is configured to expose the aperture; and an external angle between a first side surface of the first shielding structure and a plane where the aperture diaphragm is located is an obtuse angle, the first side surface of the first shielding structure being close to the aperture.

For example, in the fingerprint identification device provided by an embodiment of the present disclosure, the first shielding structure is configured to be opaque and comprises a first opening, the first opening is configured to expose the aperture.

For example, in the fingerprint identification device provided by an embodiment of the present disclosure, the first shielding structure is configured to be light transmissive and to cover the aperture.

For example, the fingerprint identification device provided by an embodiment of the present disclosure further comprises: a second shielding structure, configured to cover at least a second side surface of the first shielding structure and comprising a second opening corresponding to the aperture, the at least a second side surface of the first shielding structure being away from the aperture.

For example, in the fingerprint identification device provided by an embodiment of the present disclosure, the second shielding structure is configured to be light transmissive; an included angle between the second side surface of the first shielding structure or a tangent plane of the second side surface and a plane where the aperture diaphragm is located is an obtuse angle; and a refractive index of the second shielding structure is greater than a refractive index of the first shielding structure.

For example, in the fingerprint identification device provided by an embodiment of the present disclosure, the second side surface of the first shielding structure is a convex surface, the convex surface is configured to protrude in a direction facing towards the second shielding structure, and an included angle between a tangent line of the convex surface and the plane where the aperture diaphragm is located is an obtuse angle.

For example, in the fingerprint identification device provided by an embodiment of the present disclosure, the aperture diaphragm comprises an opaque material.

For example, in the fingerprint identification device provided by an embodiment of the present disclosure, the first shielding structure is configured to reduce or block ambient light incident on the at least one sensing unit through the aperture.

At least an embodiment of the present disclosure further provides a display panel, comprising any one of the fingerprint identification devices provided by embodiments of the present disclosure.

For example, the display panel provided by an embodiment of the present disclosure further comprises: a display pixel array, comprising a plurality of pixel units arranged in an array, wherein both the first shielding structure and the aperture are in a gap between the plurality of pixel units.

For example, in the display panel provided by an embodiment of the present disclosure, the first shielding structure is further configured as a pixel defining layer for defining respective pixel units in the display pixel array.

For example, in the display panel provided by an embodiment of the present disclosure, the first shielding structure is further configured as a spacer for supporting in the display pixel array.

For example, in the display panel provided by an embodiment of the present disclosure, the fingerprint identification device further comprises a second shielding structure, and the second shielding structure is configured as a spacer for supporting in the display pixel array.

For example, in the display panel provided by an embodiment of the present disclosure, the display pixel array comprises a conductive layer located in at least the plurality of pixel units, the aperture diaphragm and the conductive layer are located in a same layer.

For example, the display panel provided by an embodiment of the present disclosure further comprises: a base substrate, wherein the aperture diaphragm is on the base substrate, and the fingerprint sensor is located between the aperture diaphragm and the base substrate.

At least an embodiment of the present disclosure further provides a display device, comprising any one of the display panels provided by embodiments of the present disclosure.

At least an embodiment of the present disclosure further provides a fabrication method of a display panel, comprising: providing a fingerprint sensor, the fingerprint sensor comprising a plurality of sensing units; forming an aperture diaphragm on a light incident side of the fingerprint sensor, the aperture diaphragm comprising an aperture; and forming a first shielding structure on a side of the aperture diaphragm facing away from the fingerprint sensor, the first shielding structure is configured to surround at least a portion of the aperture.

For example, the fabrication method of the display panel further comprises: forming a second shielding structure on the first shielding structure and the aperture diaphragm, the second shielding structure is configured to cover at least a second side surface of the first shielding structure and comprising a second opening corresponding to the aperture, the at least a second side surface of the first shielding structure being away from the aperture.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that, the drawings of the present disclosure are not strictly drawn to actual scales; the number of apertures and the number of sensing units in a fingerprint identification device and the number of pixel units in a display panel are not limited to those illustrated in the diagrams; specific sizes and numbers of respective structures may be determined according to actual needs. The drawings in the present disclosure are merely structural schematic diagrams.

At least one embodiment of the present disclosure provides a fingerprint identification device, and the fingerprint identification device comprises a fingerprint sensor, an aperture diaphragm, and a first shielding structure. The fingerprint sensor includes a plurality of sensing units. The aperture diaphragm is provided on a light incident side of the fingerprint sensor and includes an aperture, the aperture is configured to allow the light to be incident on the sensing unit of the fingerprint sensor through the aperture. The first shielding structure is provided on a side of the aperture diaphragm facing away from the fingerprint sensor, and the first shielding structure at least partially surrounds the aperture.

Figure 1:
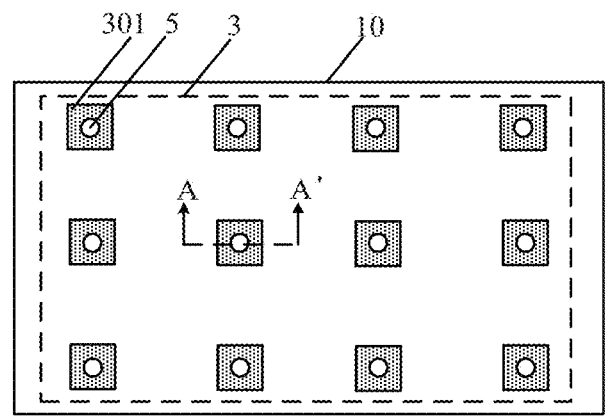
FIG. 1 is a schematic plan view of a fingerprint identification device provided by an embodiment of the present disclosure.
Figure 2A:
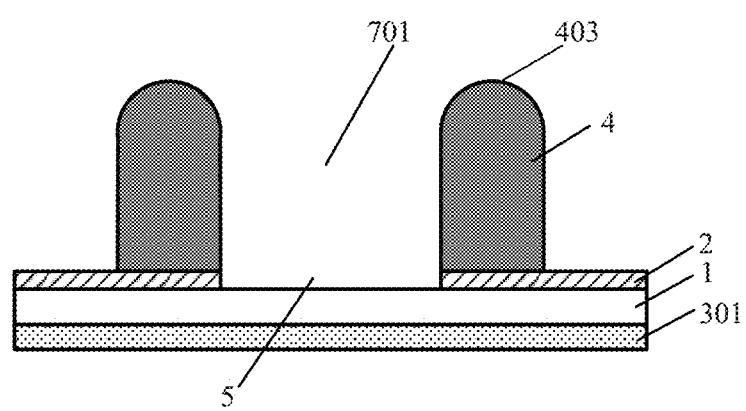
FIG. 2A is a cross-sectional schematic diagram taken along line A-A' in FIG. 1.

Exemplarily, FIG. 1 is a schematic plan view of a fingerprint identification device provided by an embodiment of the present disclosure, and FIG. 2A is a cross-sectional schematic diagram taken along line A-A' in FIG. 1.

With reference to FIG. 1 and FIG. 2A, the fingerprint identification device 10 comprises a fingerprint sensor 3, an aperture diaphragm 2, and a first shielding structure 4. The fingerprint sensor 3 includes at least one sensing unit 301. For example, a plurality of sensing units 301 are arranged in an array. The aperture diaphragm 2 is provided on a light incident side of the fingerprint sensor 3 and includes an aperture 5 through which light is allowed to be incident on the at least one sensing unit 301 of the fingerprint sensor 3, so that the sensor 3 can perform fingerprint identification. For example, as illustrated in FIG. 1, the fingerprint sensor 3 includes a plurality of apertures 5 arranged in an array; each aperture 5 corresponds to one of sensing units 301, i.e., an orthographic projection of each aperture 5 on a base substrate 1 at least partially coincides with an orthographic projection of the one of sensing units 301 on the base substrate 1, so that light is incident on the sensing unit 301 through the aperture 5, and is received by the sensing unit 301. For example, the fingerprint sensor 3 is an optical sensor, which senses light (i.e., optical signal) and converts an optical signal into an electrical signal. In case that a finger touches a fingerprint identification region of the fingerprint identification device, the light reflected by the finger is incident on a corresponding sensing unit 301 through the aperture 5. The sensing unit 301 processes the received optical signal to convert the optical signal into an electrical signal, and then outputs the electrical signal. These electrical signals are used for identifying a fingerprint. Meanwhile, the ambient light (light that is not reflected by the finger) usually enters the sensing unit 301 through the aperture 5 as well, which interferes with the optical signal used for fingerprint identification (light reflected by the finger). Hereinafter, the ambient light that interferes with fingerprint identification is referred to as interference light.

As illustrated in FIG. 1 and FIG. 2A, in the fingerprint identification device provided by the embodiment of the present disclosure, the first shielding structure 4 is provided on a side of the aperture diaphragm 2 that faces away from the fingerprint sensor 3, and the first shielding structure 4 at least partially surrounds the aperture 5. In this way, the first shielding structure 4 can prevent at least a portion of ambient light around the aperture 5 from entering the aperture 5, so as to reduce interference light incident on the sensing unit 301 through the aperture 5, increase accuracy of fingerprint identification by the sensor, and provide the user with better fingerprint identification experience. For example, as illustrated in FIG. 2A, the aperture diaphragm 2 is provided on the base substrate 1, the fingerprint sensor 3 is provided on a side of the base substrate 1 that faces away from the aperture diaphragm 2, and the first shielding structure 4 is provided on a side of the aperture diaphragm 2 away from the base substrate 1. It can be contemplated that, in another embodiment of the present disclosure, a fingerprint sensor 3 may also be located between a base substrate 1 and an aperture diaphragm 2, and other structures are the same as those illustrated in FIG. 2A.

It should be noted that, in the embodiment illustrated in FIG. 1, the first shielding structure 4 surrounds the entire aperture 5, and in other embodiment of the present disclosure, a first shielding structure 4 may also partially surround an aperture 5, i.e., the first shielding structure 4 surrounds a portion of periphery of the aperture 5, so as to at least partially reduce interference light incident on a sensing unit 301 through the aperture 5.

For example, as illustrated in FIG. 2A, the first shielding structure 4 may be opaque and includes a first opening 701 that exposes the aperture 5. Because a part of the interference light is blocked by the opaque first shielding structure 4, the interference light incident on the sensing unit 301 through the aperture 5 can be reduced, so that accuracy of fingerprint identification by the fingerprint sensor can be increased. In this case, for example, the first shielding structure may be made of an opaque organic material. For example, the first shielding structure is made of a black resin, a resin material to which black shading particles are added, and the like. It can be contemplated that, in other embodiments of the present disclosure, a first shielding structure 4 may also be light transmissive. The light transmissive first shielding structure 4 can also block interference light to a certain extent, so as to reduce interference light incident on a sensing unit 301 through an aperture 5. For example, the first shielding structure may be made of an inorganic material or an organic material, such as silicon nitride, silicon oxide, silicon oxynitride, a light transmissive resin material, or the like. It should be noted that, the material of the first shielding structure is not limited to the above-listed types.

For example, as illustrated in FIG. 2A, the first shielding structure 4 may have a doughnut shape (whose cross-sectional profile perpendicular to the base substrate 1 is columnar), so as to block interference light around the aperture 5. For example, a surface of the first shielding structure 4 that is away from the aperture diaphragm 2 is a convex surface 403 that protrudes in a direction facing away from the aperture diaphragm 2, and the convex surface 403 can better block interference light from respective directions. It can be contemplated that, in other embodiments of the present disclosure, a surface of a first shielding structure 4 that is away from an aperture diaphragm 2 may also be a flat surface, which will not be limited by the embodiment of the present disclosure.

Figure 2B:
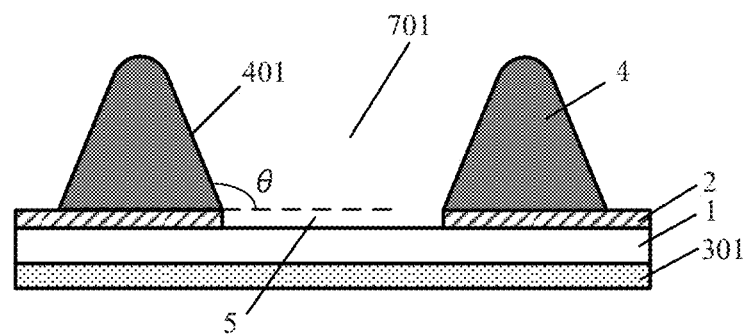
FIG. 2B is a partial cross-sectional schematic diagram of another fingerprint identification device provided by an embodiment of the present disclosure.

FIG. 2B is a partial cross-sectional schematic diagram of another fingerprint identification device provided by an embodiment of the present disclosure. For example, as illustrated in FIG. 2B, in the fingerprint identification device provided by another embodiment of the present disclosure, a first shielding structure 4 is light transmissive and includes a first opening 701 that exposes an aperture 5, and an external angle θ between a first side surface 401 of the first shielding structure 4 that is close to the aperture 5 and a plane where an aperture diaphragm 2 is located is an obtuse angle. In this way, the first shielding structure 4 and the air form a total reflection structure to reduce interference light entering the aperture, and the structure is simple and easy to fabricate. As illustrated in FIG. 2B, when interference light enters the first shielding structure 4 and is incident on the first side surface 401 of the first shielding structure 4, because the angle θ between the first side surface 401 and the plane where the aperture diaphragm 2 is located is an obtuse angle, as compared with a case where the angle θ is a right angle or an acute angle, an incident angle of light incident from the first shielding structure 4 onto the first side surface 401 of the first shielding structure 4 can be enlarged, so that more light can be totally reflected at an interface between the first side surface 401 of the first shielding structure 4 and the air, so as to reduce interference light incident on the sensing unit through the aperture 5, and increasing accuracy of the fingerprint identification device.

Figure 2C:
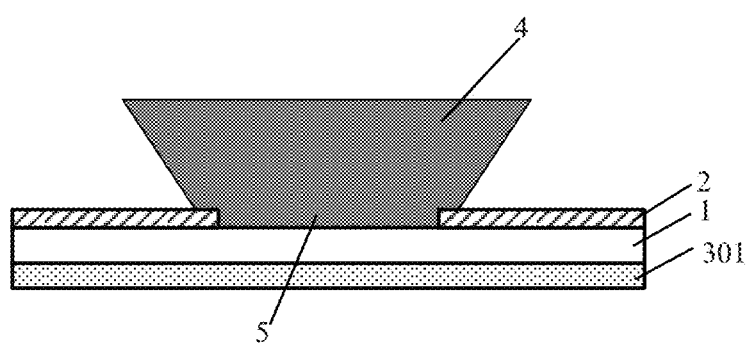
FIG. 2C is a partial cross-sectional schematic diagram of still another fingerprint identification device provided by an embodiment of the present disclosure.

FIG. 2C is a partial cross-sectional schematic diagram of still another fingerprint identification device provided by an embodiment of the present disclosure. In the embodiment illustrated in FIG. 2C, a first shielding structure 4 is light transmissive and covers an aperture 5, for example, a portion of the first shielding structure 4 is located in the aperture 5. The fingerprint identification device illustrated in FIG. 2C has a simple structure and is easy to fabricate. When fingerprint identification is performed, light reflected by a finger is transmitted through the first shielding structure 4 to enter the aperture 5, and then incident on the sensing unit 301, to implement fingerprint identification. In this case, a portion of the first shielding structure 4 that surrounds the aperture 5 can play a role of blocking to reduce interference light incident on the sensing unit through the aperture 5, so as to increasing accuracy of the fingerprint identification device.

Figure 2D:
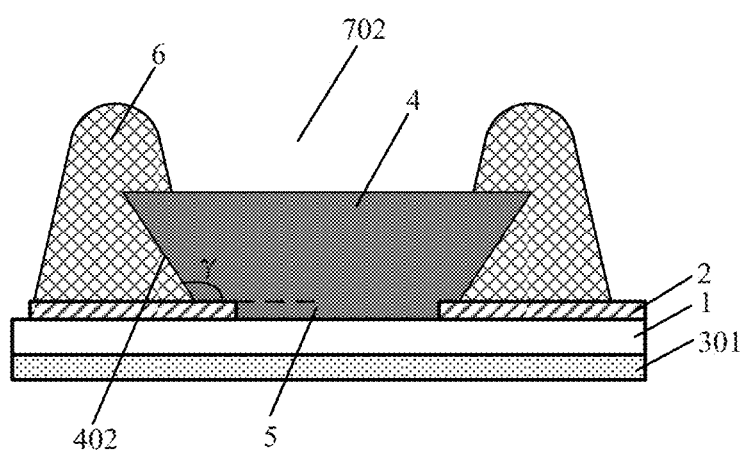
FIG. 2D is a partial cross-sectional schematic diagram of yet another fingerprint identification device provided by an embodiment of the present disclosure.

FIG. 2D is a partial cross-sectional schematic diagram of yet another fingerprint identification device provided by an embodiment of the present disclosure. In addition to a first shielding structure 4, the fingerprint identification device 10 further comprises a second shielding structure 6. For example, the second shielding structure 6 covers at least a second side surface 402 of the first shielding structure 4 that is away from an aperture 5 and includes a second opening 702 corresponding to the aperture 5. For example, the first shielding structure 4 is light transmissive. When fingerprint identification is performed, light reflected by a finger is transmitted through the first shielding structure 4 to enter the aperture 5, and then is incident on the sensing unit 301 through the aperture 5, to implement fingerprint identification. Because the second shielding structure 6 has the second opening 702 corresponding to the aperture 5, the light reflected by the finger may not pass through the second shielding structure 6 before entering the first shielding structure 4, so that utilization efficiency of light can be increased.

In one example of the embodiment illustrated in FIG. 2D, for example, the second shielding structure 6 is opaque; and on a basis that a portion of the first shielding structure 4 that surrounds the aperture 5 plays a role in blocking interference light, the opaque second shielding structure 6 further plays a role in blocking interference light, which can reduce interference light incident on the sensing unit 301 through the aperture 5, and increasing accuracy of fingerprint identification by the fingerprint sensor. For example, the second shielding structure 6 may be made of an opaque organic material, for example, a black resin, i.e., a resin material to which black shading particles are added, and the like. It can be contemplated that, the material of the opaque second shielding structure is not limited to the above-described types.

In another example of the embodiment illustrated in FIG. 2D, for example, the second shielding structure 6 is light transmissive, and an included angle γ between the second side surface 402 of the first shielding structure 4 and a plane where an aperture diaphragm 2 is located is an obtuse angle. For example, a refractive index of the second shielding structure 6 is greater than a refractive index of the first shielding structure 4, so as to constitute total reflection. As illustrated in FIG. 2D, because the refractive index of the second shielding structure 6 is greater than the refractive index of the first shielding structure 4, when interference light is incident on the second side surface 402 of the first shielding structure 4 through the second shielding structure 6, light that satisfies a total reflection condition can be totally reflected on the second side surface 402 of the first shielding structure 4, so as to reduce interference light incident on the sensing unit through the aperture 5. In the embodiment illustrated in FIG. 2D, the included angle γ between the second side surface 402 of the first shielding structure 4 and the plane where the aperture diaphragm 2 is located is an obtuse angle, which can enlarge an incident angle of light incident from the second shielding structure 6 to the second side surface 402 of the first shielding structure 4, so that more light can be totally reflected on the second side surface 402 of the first shielding structure 4, as a result, the interference light entering the sensing unit through the aperture 5 is reduced, and accuracy of the fingerprint identification device is increased. In this case, for example, the second shielding structure 6 may be made of silicon dioxide, silicon nitride, or titanium dioxide, etc., all of which has a higher refractive index; and the first shielding structure 4 may be made of magnesium fluoride, porous silica, or silicon oxyfluoride, etc., all of which has a lower refractive index. It can be contemplated that, the material of the second shielding structure 6 and the material of the first shielding structure 4 are not limited to the above-enumerated types, as long as the above-described requirements are met.

Figure 2E:
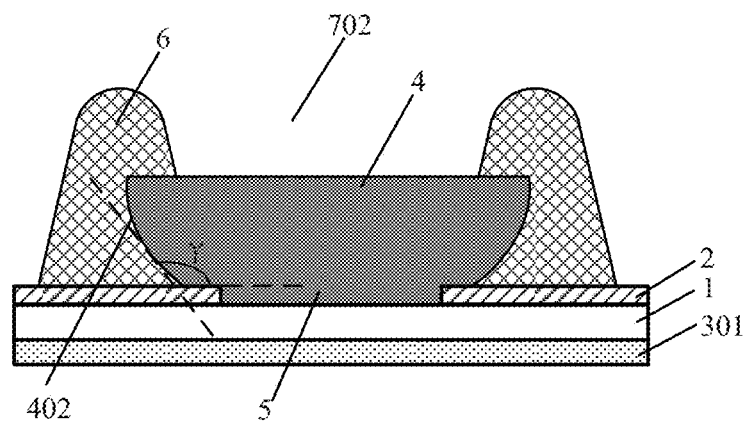
FIG. 2E is a partial cross-sectional schematic diagram of a further fingerprint identification device provided by an embodiment of the present disclosure.

FIG. 2E is a partial cross-sectional schematic diagram of a further fingerprint identification device provided by an embodiment of the present disclosure. This embodiment differs from the embodiment of FIG. 2D in that, a second side surface 402 of a first shielding structure 4 is a convex surface that protrudes in a direction facing towards a second shielding structure 6, and an included angle γ between a tangent line of the convex surface and a plane where an aperture diaphragm 2 is located is an obtuse angle. On a basis of the technical effect achieved by the embodiment illustrated in FIG. 2D, because curvatures of respective positions of the second side surface 402 of the first shielding structure 4 are different, as compared with a case where the second side surface 402 is an inclined planar surface, it is favorable for totally reflecting interference light incident from the second shielding structure 6 onto the second side surface 402 of the first shielding structure 4 along respective directions, which can prevent more interference light from entering the sensing unit through the aperture 5, and better increasing accuracy of the fingerprint identification device.

For example, the aperture diaphragm includes an opaque material, for example, a material of the aperture diaphragm other than the aperture includes an opaque material. For example, the aperture diaphragm may be formed of an opaque material. The opaque material may be, for example, an opaque inorganic material, for example, a metal material or an alloy, for example, aluminum, chromium, copper, an aluminum alloy, a nickel alloy, a copper alloy, and the like. The opaque material may be, for example, an organic material, for example, a black resin. For example, the material of the aperture diaphragm may include a photosensitive material, such that the aperture diaphragm may be easily fabricated by using a photolithography method. For example, the photosensitive material may include a photoresist material or a metal halide, and the metal halide is, for example, a silver halide (for example, AgCl or AgBr). For example, the aperture diaphragm may be formed by using an exposure-development process. The metal halide is decomposed to form metal particles after exposure, and the metal particles may appear black because the particles are small, so as to achieve an effect that the material of the aperture diaphragm other than the aperture is opaque. It should be noted that, the material of the aperture diaphragm is not limited to the above-enumerated types, as long as the material of the portion of the aperture diaphragm other than the aperture is an opaque material, which will not be limited in the embodiment of the present disclosure.

For example, the sensing unit 301 may include components such as a photoelectric conversion element (for example, a photodiode, a phototransistor, etc.) and a switch transistor electrically connected with the photoelectric conversion element. For example, the photoelectric conversion element may convert an optical signal irradiated thereon into an electrical signal, and the switch transistor may control whether to read the electrical signal obtained by collecting the optical signal on the photoelectric conversion element. For example, the photodiode is a photosensitive diode. A conventional technology in the art may be referred to for a specific structure of the sensing unit of the fingerprint sensor, which will not be repeated here.

Figure 2F:
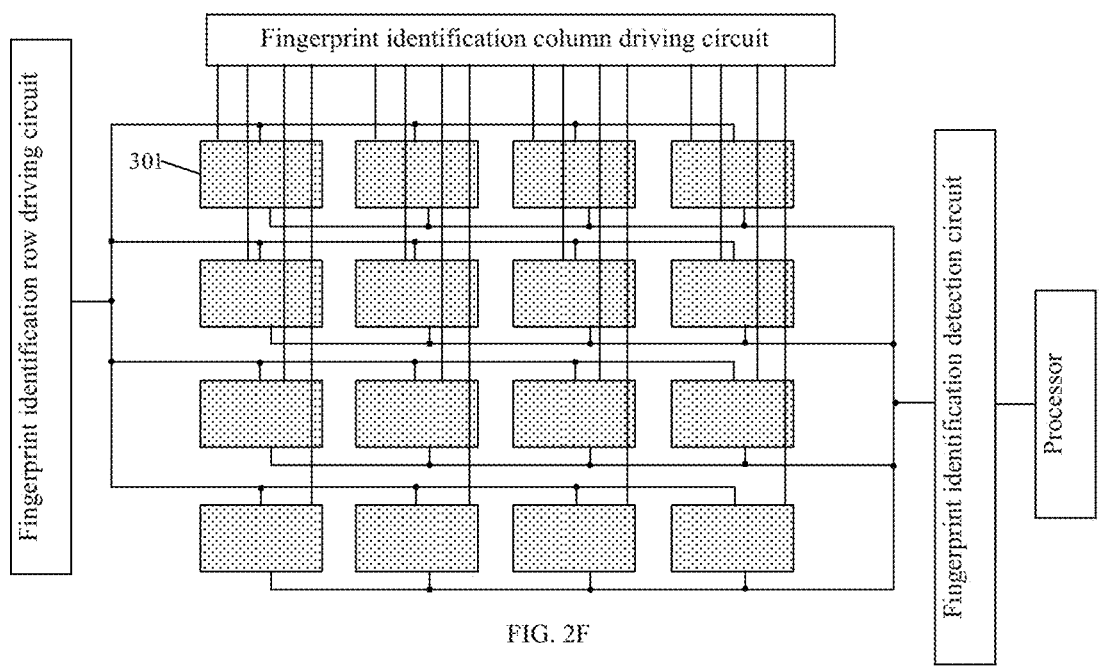
FIG. 2F is a block diagram of a driving principle of an image sensor provided by the embodiment of the present disclosure.

The fingerprint identification device provided by the embodiment of the present disclosure further comprises a fingerprint identification detection module and a processor. FIG. 2F is a block diagram of a driving principle of an image sensor provided by the embodiment of the present disclosure. For example, as illustrated in FIG. 2F, a fingerprint identification driving module may be a fingerprint identification drive circuit, and the fingerprint identification driving circuit includes a fingerprint identification row driving circuit and a fingerprint identification column driving circuit. For example, the fingerprint identification row driving circuit includes a plurality of sensing gate lines respectively coupled to the respective sensing units 301 arranged in an array, and the fingerprint identification column driving circuit includes a plurality of sensing data lines respectively coupled to the respective sensing units 301 arranged in an array, to provide a scan signal for the sensing units 301. For example, the fingerprint identification detection module may be a fingerprint identification detection circuit, and the fingerprint identification detection circuit is coupled to the respective sensing units 301 of the fingerprint sensor to read an electrical signal from the sensing units 301. For example, the fingerprint identification detection circuit is in signal communication with the processor, the fingerprint identification detection circuit sends the electrical signal to the processor, and the processor processes the received electrical signal, for example, the processor compares the electrical signal with a data signal corresponding to a pre-stored standard fingerprint, so as to implement fingerprint identification. For example, the processor may be a digital signal processor (DSP), a programmable logic controller (PLC), and so on. The fingerprint identification driving circuit and the fingerprint identification detection circuit may be fabricated on a same base substrate as the sensing units 301, or separately provided and electrically connected with the respective sensing units 301. It can be contemplated that, types and connection modes of the fingerprint sensor driving structure, the fingerprint identification detecting structure and the processor are not limited to the above-described examples, and will not be limited in the embodiment of the present disclosure; and those skilled in the art may refer to the conventional technology in the art.

It should be noted that, the drawings of the present disclosure only show the structure related to the shielding structure of the fingerprint identification device, and for other structures, the conventional technology in the art may be referred to.

At least one embodiment of the present disclosure further provides a display panel, and the display panel comprises any one fingerprint identification device provided by the embodiment of the present disclosure.

Figure 3A:
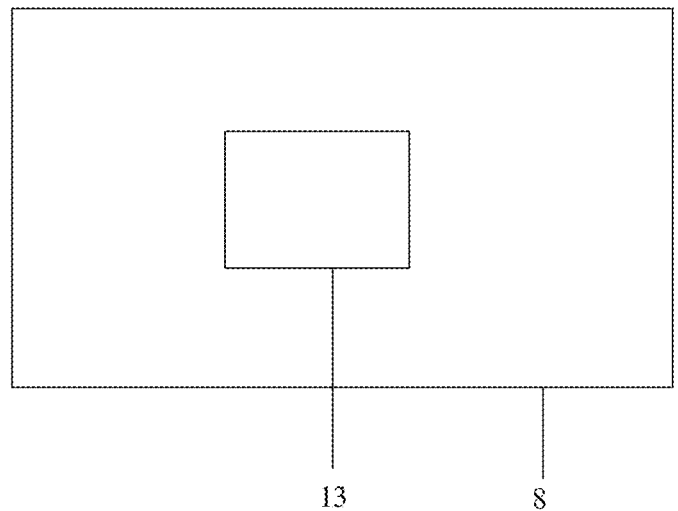
FIG. 3A is a schematic plan view of a display panel provided by an embodiment of the present disclosure.
Figure 3B:
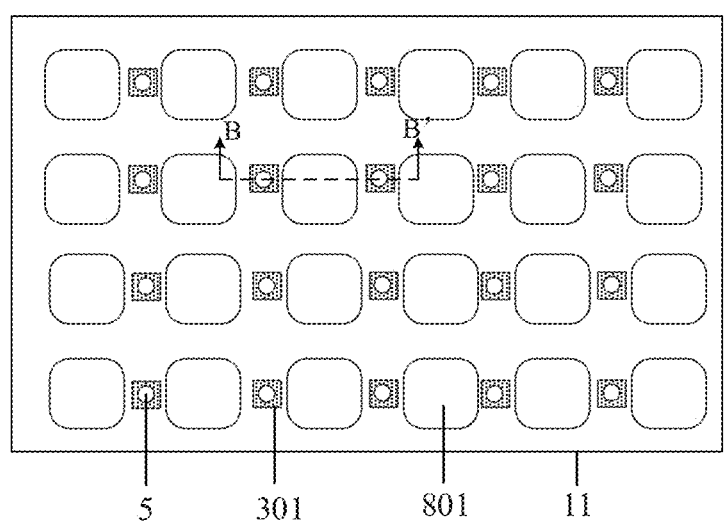
FIG. 3B is a schematic plan view of a region provided with a sensing unit in a display panel provided by an embodiment of the present disclosure.
Figure 3C:
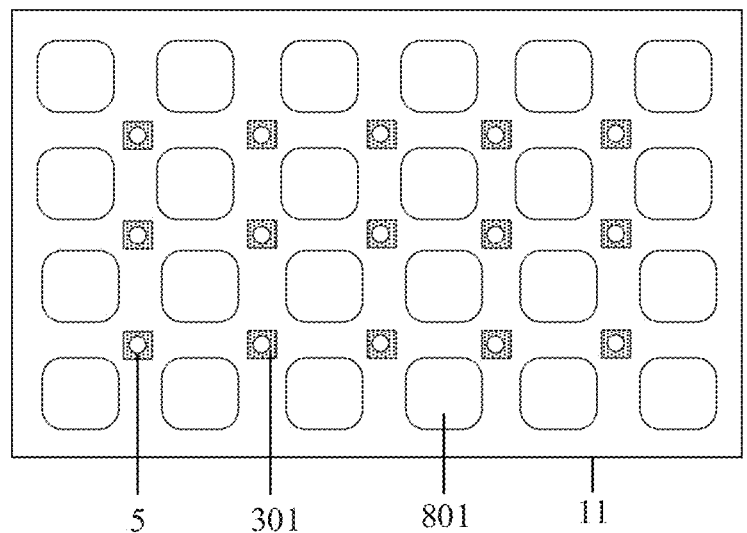
FIG. 3C is a schematic plan view of a region provided with a sensing unit in another display panel provided by an embodiment of the present disclosure.
Figure 3D:
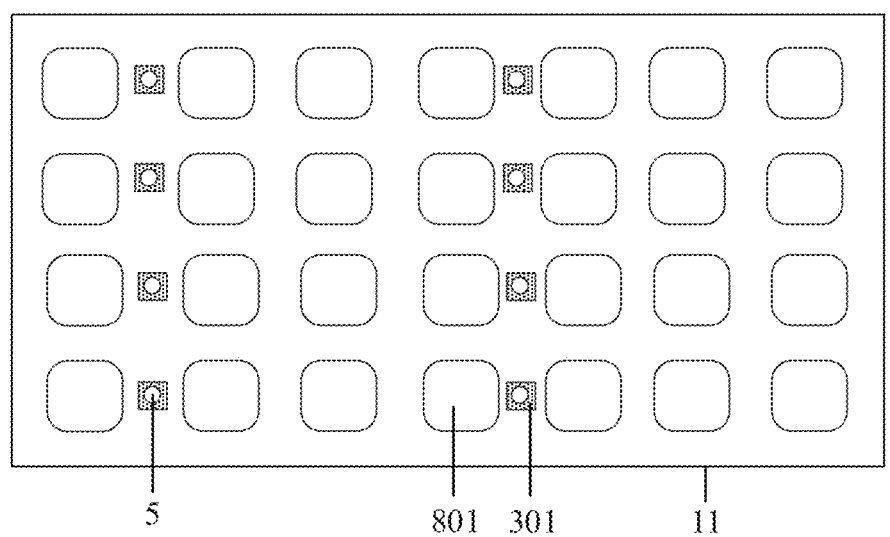
FIG. 3D is a schematic plan view of a region provided with a sensing unit in still another display panel provided by an embodiment of the present disclosure.

Exemplarily, FIG. 3A is a schematic plan view of a display panel provided by an embodiment of the present disclosure, FIG. 3B is a schematic plan view of a region provided with a sensing unit in a display panel provided by an embodiment of the present disclosure, FIG. 3C is a schematic plan view of a region provided with a sensing unit in another display panel provided by an embodiment of the present disclosure, and FIG. 3D is a schematic plan view of a region provided with a sensing unit in still another display panel provided by an embodiment of the present disclosure.

As illustrated in FIG. 3A, the display panel 11 further comprises a display pixel array 8. In the display panel 11, a fingerprint sensor may be provided in a region 13 provided with a sensing unit in the display panel, for receiving light reflected by a finger. For example, in the example illustrated in FIG. 3A, the region 13 provided with the sensing unit may correspond to a portion of a region of the display pixel array 8 of the display panel 11. It can be contemplated that, in other examples, the region 13 provided with the sensing unit may also correspond to the entire display pixel array 8 of the display panel 11, to enlarge a photosensitive area of the fingerprint sensor, and achieve a better fingerprint identification effect.

For example, as illustrated in FIG. 3B to FIG. 3D, a display pixel array 8 includes a plurality of pixel units 801 arranged in an array, a first shielding structure (not illustrated in FIG. 3B to FIG. 3D) and an aperture 5 are provided in a gap between pixel units 801. A position for providing the aperture 5 in an aperture diaphragm 2 may be set according to actual application needs, and will not be specifically limited in the embodiment of the present disclosure.

For example, as illustrated in FIG. 3B, each aperture 5 may be provided between two adjacent pixel units 801; for another example, as illustrated in FIG. 3C, each aperture 5 may be provided among four adjacent pixel units 801; for still another example, as illustrated in FIG. 3D, every three pixel units 801 may correspond to one aperture 5, which, thus, can reduce the number of sensing units 301 provided and reduce fabrication costs. It can be contemplated that, in the embodiment of the present disclosure, the position for providing the aperture 5 in the aperture diaphragm 2 is not limited to the above modes.

Figure 4A:
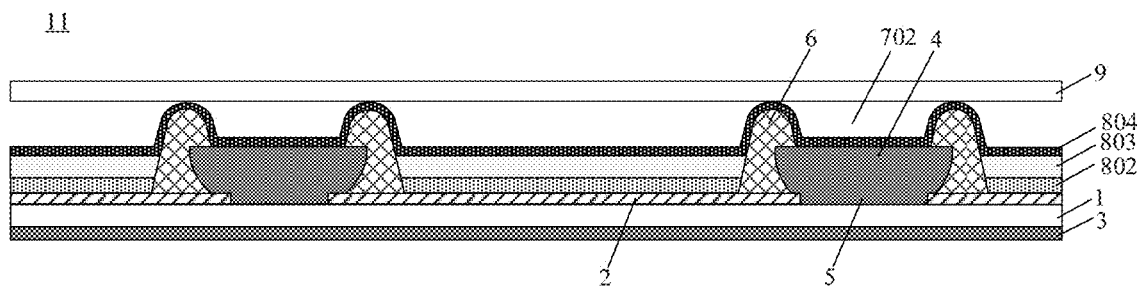
FIG. 4A is a cross-sectional schematic diagram taken along line B-B' in FIG. 3B.
Figure 4B:
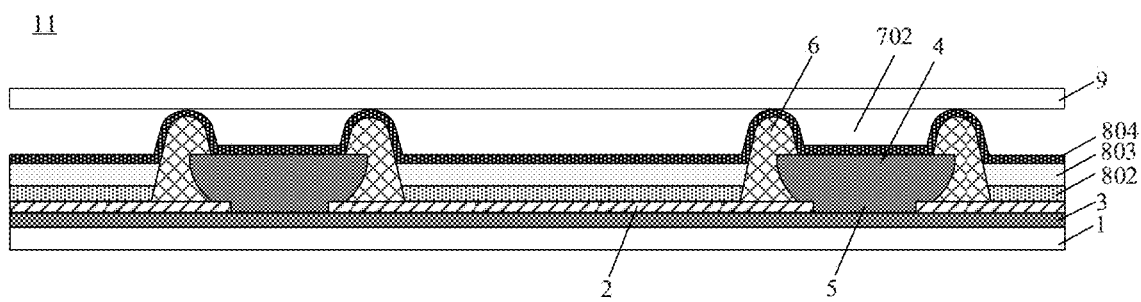
FIG. 4B is a partial cross-sectional schematic diagram of a display panel provided by an embodiment of the present disclosure.
Figure 4C:
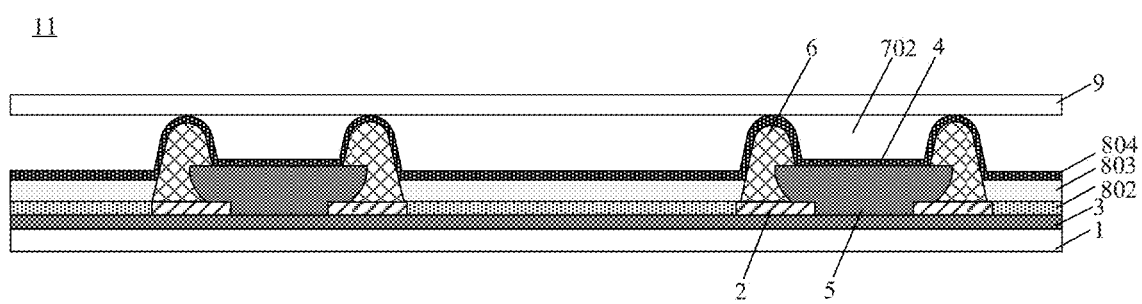
FIG. 4C is a partial cross-sectional schematic diagram of another display panel provided by an embodiment of the present disclosure.

Hereinafter, it is illustrated with the cross-sectional view of FIG. 3B as an example. FIG. 4A is a cross-sectional schematic diagram taken along line B-B' in FIG. 3B, FIG. 4B is a partial cross-sectional schematic diagram of a display panel provided by an embodiment of the present disclosure, and FIG. 4C is a partial cross-sectional schematic diagram of another display panel provided by an embodiment of the present disclosure.

As illustrated in FIG. 3B and FIG. 4A, for example, the display pixel array 8 includes a plurality of pixel units 801 arranged in an array and a display element at least located in each of the pixel units 801. The display element includes a conductive layer, that is, the display pixel array 8 includes the conductive layer located in at least the pixel units 801.

In an embodiment of the present disclosure, a display panel 11 is an organic light-emitting diode display panel, which is taken as an example for description in the present disclosure. For example, the display element may be an organic light-emitting diode component, and the organic light-emitting diode component may have a top-emitting structure, or a bottom-emitting structure, etc. For example, the organic light-emitting diode component includes a first electrode 802, an organic light-emitting layer 803 and a second electrode 804. Both the first electrode 802 and the second electrode 804 are the conductive layers. For example, the first electrode 802 is provided on a base substrate 1. For example, as illustrated in FIG. 4A, the first electrode 802 may be provided on an aperture diaphragm 2. The organic light-emitting layer 803 is provided on the first electrode 802. For example, in the embodiment illustrated in FIG. 4A, the second electrode 804 is a common electrode that covers the organic light-emitting layer 803, a first shielding structure 4, and a second shielding structure 6. It should be noted that, in at least one embodiment of the present disclosure, a display panel is not limited to an organic light-emitting display panel, and correspondingly, a display element is not limited to the above-described organic light-emitting diode component.

For example, the display panel 11 further comprises a display driving circuit. For example, the display driving circuit includes signal lines, etc., such as, a plurality of display gate lines and display data lines (not illustrated) coupled to respective pixel units of the display pixel array, so as to provide a scan signal and a data signal for the pixel units of the display pixel array for display. Conventional designs in the art may be referred to for the display driving circuit, the fingerprint identification row driving circuit and the fingerprint identification column driving circuit of the image sensor, for example, the row driving circuit and the column driving circuit, etc. may be integrated in a same control circuit or chip, which will not be limited in the embodiment of the present disclosure.

In the embodiment illustrated in FIG. 4A, the first electrode 802 may be an anode, and the second electrode 804 may be a cathode. For example, the anode is a common electrode, and when the display panel 11 performs a display function, a low-level signal is input to the common electrode through the display driving circuit. For example, the anode may be a reflecting electrode, or a reflecting layer (not illustrated) may be provided at a position adjacent to the anode; and in a process of display, light is emitted from a cathode side to implement display. In other embodiment of the present disclosure, a second electrode 804 may also be an anode, and a first electrode 802 is a cathode, for example, the anode is a common electrode. When the display panel 11 performs a display function, a high-level signal is input to the common electrode through a display driving circuit.

For example, as illustrated in FIG. 4A, the display pixel array 8 further includes a pixel defining layer that defines a plurality of pixel units, to prevent crosstalk of adjacent pixel units or light between adjacent pixel units. The pixel defining layer includes an opening corresponding to a pixel unit 801, and the organic light-emitting layer 803 is at least provided in the opening, for example, the common electrode covers the pixel defining layer. For example, the first shielding structure 4 may be further configured as a portion of the pixel defining layer, so that it is not necessary to additionally provide the first shielding structure in particular, which achieves an effect of simplifying a structure of the display panel. For example, in this case, the first shielding structure 4 is light transmissive, that is, the pixel defining layer is light transmissive; however, because the second shielding structure 6 and the first shielding structure 4 constitute a total reflection structure, which avoid or prevent the problem of crosstalk between adjacent pixel units or the problem of light crosstalk between adjacent pixel units. Meanwhile, it is favorable for increasing an aperture ratio of the display panel, as compared with a case of a display panel whose pixel defining layer is opaque.

For example, as illustrated in FIG. 4A, the second shielding structure 6 may be further configured as a spacer for supporting in the display pixel array, for example, the spacer is used for supporting an encapsulation layer 9, and for example, the encapsulation layer 9 is an encapsulation cover plate, etc. It can be contemplated that, for example, the display panel 11 may also be a liquid crystal display panel, and the second shielding structure 6 may also be configured as a columnar spacer in the liquid crystal display panel, for supporting a base substrate and an opposite substrate of the liquid crystal display panel. In another embodiment of the present disclosure, when a first shielding structure is a structure illustrated in FIG. 2A or FIG. 2B, the first shielding structure may also be configured as a spacer.

For example, in the display panel 11 illustrated in FIG. 4A, a fingerprint sensor 3 is located on a side of the base substrate 1 that is away from the aperture diaphragm 2. For example, in the embodiment illustrated in FIG. 4B, a fingerprint sensor 3 may also be located between an aperture diaphragm 2 and a base substrate 1, such that when fingerprint identification is performed, light reflected by a finger directly enters the fingerprint sensor 3 through an aperture 5, without passing through the base substrate 1, which can reduce loss of light, so as to increase accuracy of fingerprint identification. Other structures of the display panel 11 illustrated in FIG. 4B are the same as those in FIG. 4A, and foregoing description may be referred to, which will not be repeated here.

For example, in another embodiment of the present disclosure, an aperture diaphragm may be located in a same layer as a conductive layer of a display pixel array. Exemplarily, as illustrated in FIG. 4C, an aperture diaphragm 2 and a first electrode 802 are located in a same layer, that is, both the aperture diaphragm 2 and the first electrode 802 are located on a fingerprint sensor 3 and both are in contact with the fingerprint sensor 3; or, a top surface of the aperture diaphragm 2 is located in a same plane as a top surface of the first electrode 802, which, thus, can simplify a structure and a fabrication process of a display panel 11, and is favorable for thinning the display panel 11. Other structures of the display panel 11 illustrated in FIG. 4C are the same as those in FIG. 4A, for which foregoing description may be referred to.

Figure 4D:
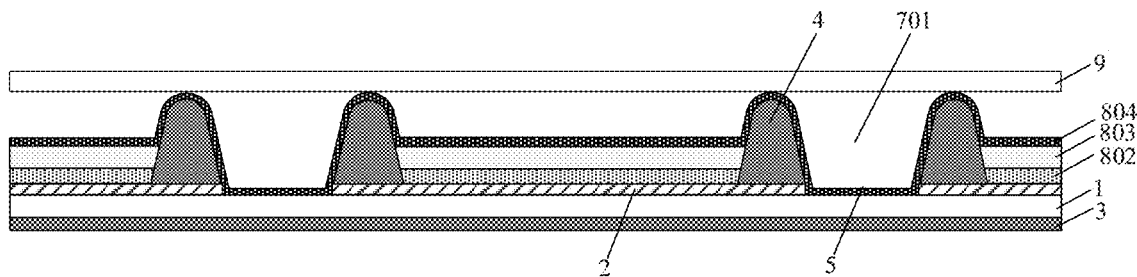
FIG. 4D is a partial cross-sectional schematic diagram of still another display panel provided by an embodiment of the present disclosure.
Figure 4E:
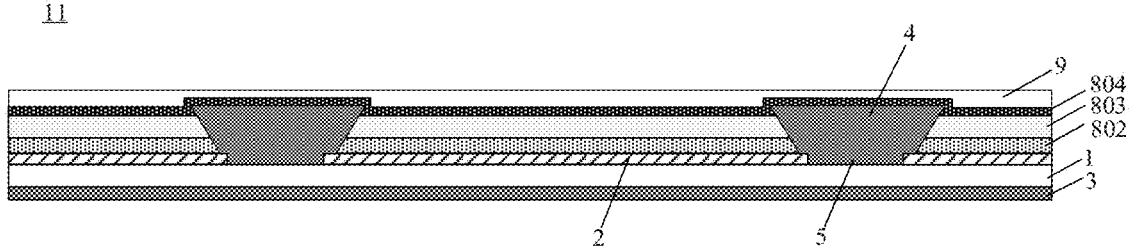
FIG. 4E is a partial cross-sectional schematic diagram of yet another display panel provided by an embodiment of the present disclosure.

For example, in a display panel provided by another embodiment of the present disclosure, a fingerprint identification device comprises any one of the first shielding structures illustrated in FIG. 2A to FIG. 2C, excluding the second shielding structure. For example, as illustrated in FIG. 4D, a fingerprint identification device in a display panel 11 may comprise the first shielding structure 4 illustrated in FIG. 2B, and the first shielding structure 4 is further configured as a spacer. For another example, as illustrated in FIG. 4E, a fingerprint identification device in a display panel 11 may comprise the first shielding structure 4 illustrated in FIG. 2C, and the first shielding structure 4 is further configured as a pixel defining layer. Other structures of the display panels 11 illustrated in FIG. 4D and FIG. 4E are the same as those in FIG. 4A, for which foregoing description may be referred to.

Figure 5:
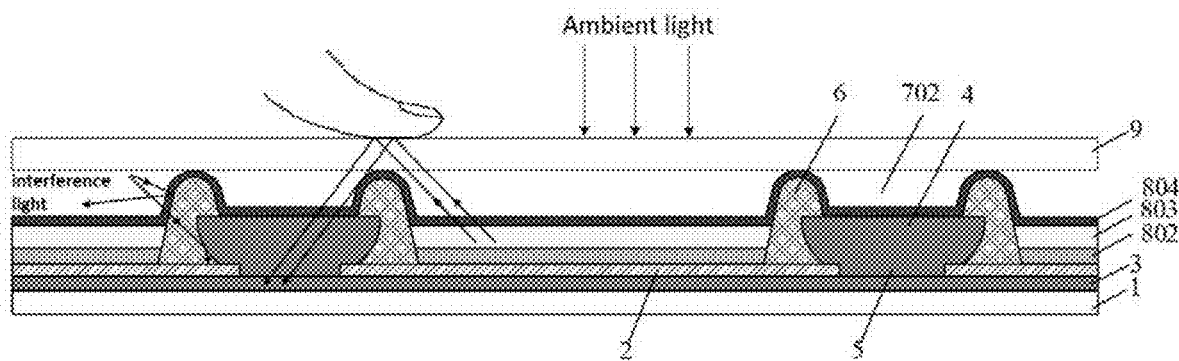
FIG. 5 is a schematic diagram of an optical path when the display panel of FIG. 4B performs fingerprint identification.

The display panel provided by the embodiment of the present disclosure can implement fingerprint identification in a region corresponding to the display pixel array. FIG. 5 is a schematic diagram of an optical path when the display panel illustrated in FIG. 4B performs fingerprint identification; hereinafter, it is described with the display panel illustrated in FIG. 4B as an example; and a fingerprint identification optical path and effect of a display panel provided by other embodiment is similar thereto. As illustrated in FIG. 5, when the display panel 11 performs fingerprint identification, a finger touches a fingerprint identification region corresponding to the display pixel array of the display panel, light emitted from the organic light-emitting layer 803 is incident on a surface of the finger that is in contact with the display panel 11, after being reflected on the surface of the finger, the light enters the aperture 5 corresponding to the position where the finger is located, then is incident on the fingerprint sensor 3, and is received by the sensing unit of the fingerprint sensor 3, to implement the fingerprint identification function. On the one hand, the first shielding structure 4 and the second shielding structure 6 can respectively prevent at least a portion of interference light around the aperture 5 (light that is not reflected by the finger, for example, ambient light, backlight, light from the organic light-emitting layer, etc.) from being incident on the aperture 5, so as to reduce interference light incident on the fingerprint sensor 3 through the aperture 5; on the other hand, the first shielding structure 4 and the second shielding structure 6 form a total reflection structure, and a portion of interference light incident from the second shielding structure 6 into the first shielding structure 4 can be totally reflected on a second side surface 402 of the first shielding structure 4, so that interference light entering the sensing unit through the aperture 5 may be reduced. Therefore, in the display panel provided by the embodiment of the present disclosure, accuracy of fingerprint identification can be increased, which can provide a user with better fingerprint identification experience.

It should be noted that, in other embodiment of the present disclosure, light incident on a finger may also be light from a backlight, and so on.

At least one embodiment of the present disclosure further provides a display device, and the display device comprises any display panel provided by the embodiment of the present disclosure.

Figure 6:
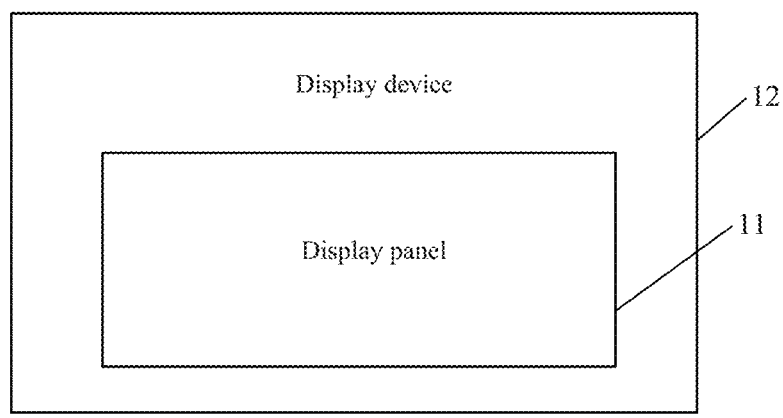
FIG. 6 is a schematic diagram of a display device provided by an embodiment of the present disclosure.

Exemplarily, FIG. 6 is a schematic diagram of a display device provided by an embodiment of the present disclosure. As illustrated in FIG. 6, the display device 12 comprises any one display panel 11 provided by the embodiment of the present disclosure. For example, the display device may be an organic light emitting diode display device, a liquid crystal display device, and so on.

For example, the display device may be implemented as a product below: a mobile phone, a tablet personal computer, a television, a monitor, a laptop, a digital photo frame, a navigator, an electronic advertisement screen, and any other product or component having a display function.

FIG. 6 is only a schematic diagram of the display device comprising any one display panel provided by the embodiment of the present disclosure; other structures of the display device are not illustrated, and those skilled in the art may refer to a conventional technology, which will not be limited in this embodiment.

The display device provided by the embodiment of the present disclosure can implement fingerprint identification in a region corresponding to the display pixel array, that is, perform fingerprint identification in the display region. The display device provided by the embodiment of the present disclosure, when performing fingerprint identification, can reduce or prevent interference light from entering the fingerprint sensor, so that accuracy of fingerprint identification can be increased, which can provide a user with better fingerprint identification experience.

At least one embodiment of the present disclosure further provides a fabrication method of a display panel, and the fabrication method of the display panel comprises: providing a fingerprint sensor, the fingerprint sensor including a plurality of sensing units; forming an aperture diaphragm on a light incident side of the fingerprint sensor, the aperture diaphragm including an aperture; forming a first shielding structure on a side of the aperture diaphragm that faces away from the fingerprint sensor, the first shielding structure surrounds at least a portion of the aperture.

Exemplarily, FIG. 7A to FIG. 7I are schematic diagrams of a fabrication method of a display panel provided by an embodiment of the present disclosure.

Figure 7A:
FIG. 7A to FIG. 7I are schematic diagrams of a fabrication method of a display panel provided by an embodiment of the present disclosure.

As illustrated in FIG. 7A, a base substrate 1 and a fingerprint sensor 3 are provided. The fingerprint sensor 3 includes a plurality of sensing units. For example, the plurality of sensing units are arranged in an array. The fingerprint sensor 3 is provided on the base substrate 1, or the fingerprint sensor 3 is directly fabricated on the base substrate 1 by using a semiconductor process, and the like. In addition, a pixel circuit (not illustrated) for driving an organic light-emitting diode component may be further formed on the base substrate 1, for example, the pixel circuit includes a plurality of thin film transistors, storage capacitors, and other devices, and may be prepared by using a method and material known in the art, which will not be repeated here.

Figure 7B:
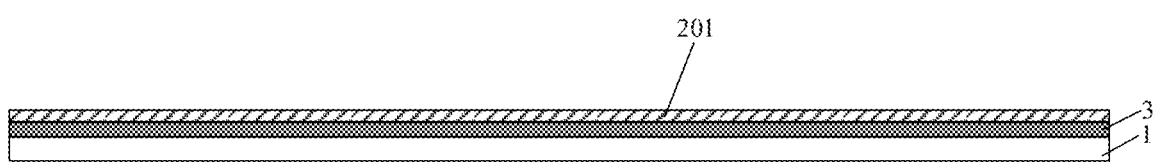

As illustrated in FIG. 7B, a prefabricated stop layer 201 for forming an array of apertures is formed on the fingerprint sensor 3. A material of the prefabricated stop layer includes an opaque material, for example, it may be an opaque inorganic material, for example, a metal material or an alloy, such as aluminum, chromium, copper, an aluminum alloy, a nickel alloy, a copper alloy, and the like. The opaque material may also be, for example, an organic material, such as a black resin. For example, the prefabricated stop layer 201 may also be made of a photosensitive material, such that the aperture diaphragm is easily fabricated. For example, the photosensitive material may include a photoresist material or a metal halide, and the metal halide is, for example, a silver halide (for example, AgCl or AgBr).

It should be noted that, the material of the prefabricated stop layer is not limited to the above-enumerated types, and will not be limited in the embodiment of the present disclosure. When the prefabricated stop layer 201 is made of an organic material, for example, it may be formed by using a coating method; when the prefabricated stop layer 201 is made of an inorganic material, for example, it may be formed by using a deposition method, such as magnetron sputter deposition, chemical vapor deposition, etc.; and those skilled in the art may select a suitable fabrication method according to a specific material of the prefabricated stop layer 201.

Figure 7C:
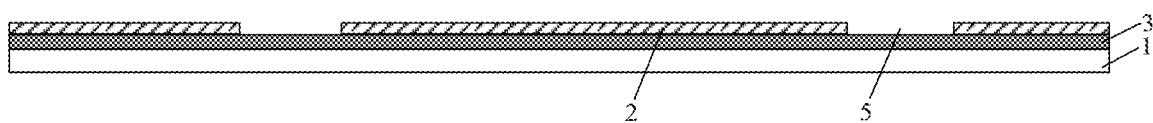

As illustrated in FIG. 7C, the array of apertures is formed of the prefabricated stop layer 201 by using a patterning process, so as to form an aperture diaphragm 2 including a plurality of apertures 5 arranged in an array on the light incident side of the fingerprint sensor 3. For example, the apertures 5 may be formed by using a photolithography process. When the prefabricated stop layer 201 is made of a photosensitive material including a photoresist material and a metal halide (for example, AgCl or AgBr), the aperture diaphragm 2 may be formed through an exposure-development process by using a mask. The metal halide may be decomposed to form metal particles after exposure, and the metal particles may appear black because the particles are small, so as to achieve an effect that the material of the portion of the aperture diaphragm other than the aperture is opaque. When the prefabricated stop layer 201 is made of an inorganic material, for example, the aperture diaphragm 2 may be formed by using an exposure-development-etching-ashing process. It can be contemplated that, the patterning process for forming the array of apertures is not limited to the above-described categories.

Figure 7D:
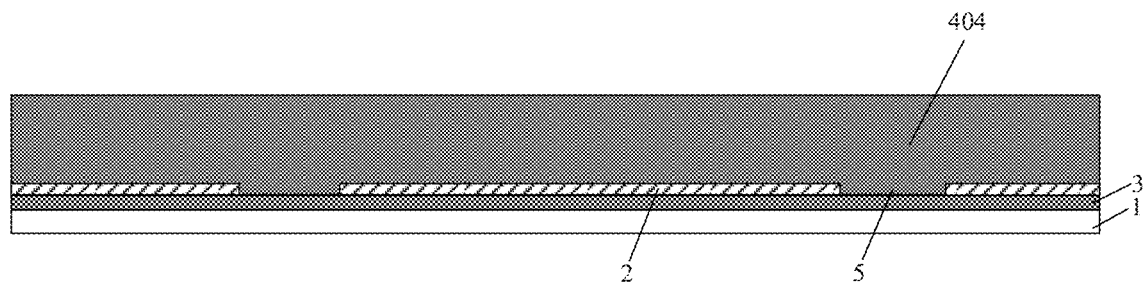

As illustrated in FIG. 7D, a first light shielding layer 404 for forming a first shielding structure is formed on the aperture diaphragm 2. Foregoing description of the material of the first shielding structure may be referred to for a material of the first light shielding layer 404. When the first light shielding layer 404 is made of an organic material, for example, it may be formed by using a coating method; when the first light shielding layer 404 is made of an inorganic material, for example, it may be formed by using a deposition method, such as magnetron sputter deposition, chemical vapor deposition, etc.; and those skilled in the art may select a suitable fabrication method according to a specific material of the first light shielding layer 404.

Figure 7E:
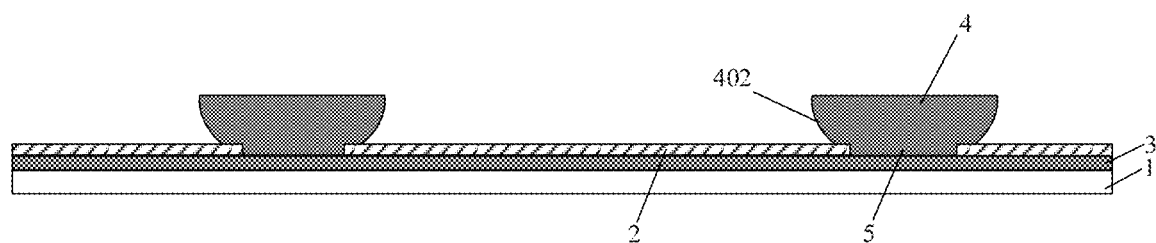

As illustrated in FIG. 7E, the first shielding structure 4 is formed of the first light shielding layer 404 by using a patterning process, and the patterning process is, for example, a photolithography process, and the like. The first shielding structure 4 is light transmissive, and includes a portion surrounding the aperture 5, and the first shielding structure 4 covers the aperture 5. An included angle γ between a tangent line of a second side surface 402 of the first shielding structure 4 and a plane where the aperture diaphragm 2 is located is an obtuse angle. For example, the first light shielding layer 404 is etched and patterned by using a wet etching method, so that an under-cut configuration may be implemented. When fingerprint identification is performed, light reflected by a finger is transmitted through the first shielding structure 4 to enter the aperture 5, and then is incident on the sensing unit of the sensor, to implement fingerprint identification. In this case, the portion of the first shielding structure 4 that surrounds the aperture 5 can play a role of blocking to reduce interference light incident on the sensing unit through the aperture 5, so as to increase accuracy of the fingerprint identification device.

Figure 7F:
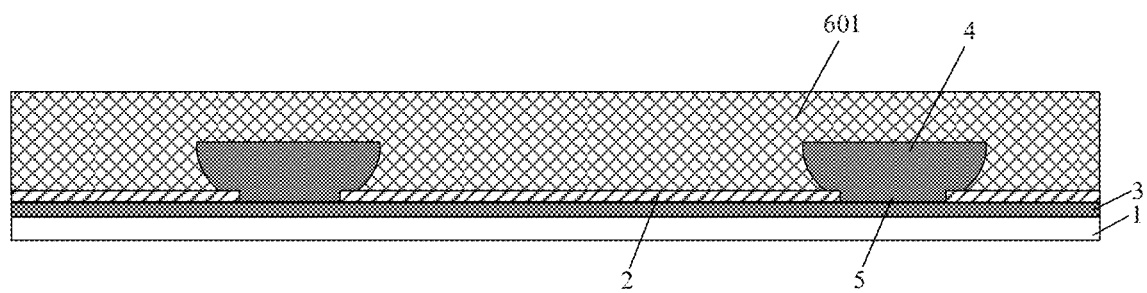

As illustrated in FIG. 7F, a second light shielding layer 601 for forming a second shielding structure is formed on the first shielding structure 4 and the aperture diaphragm 2. Foregoing description of the material of the second shielding structure may be referred to for a material of the second light shielding layer 601. When the second light shielding layer 601 is made of an organic material, for example, it may be formed by using a coating method; when the second light shielding layer 601 is made of an inorganic material, for example, it may be formed by using a deposition method, for example, magnetron sputter deposition, chemical vapor deposition, etc.; and those skilled in the art may select a suitable fabrication method according to a specific material of the second light shielding layer 601.

Figure 7G:
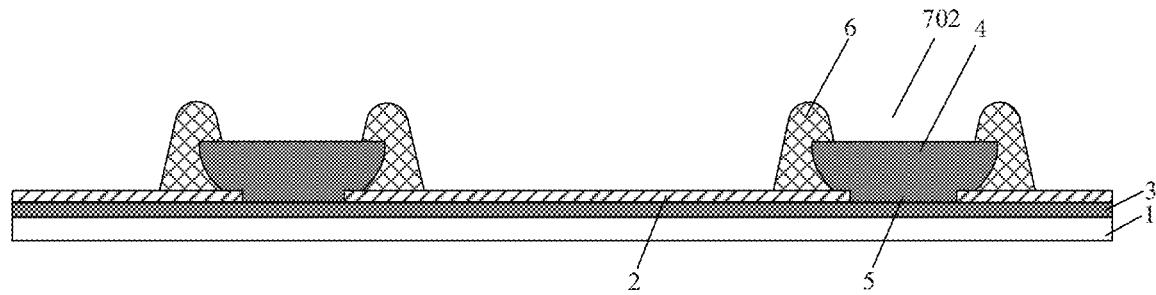

As illustrated in FIG. 7G, the second shielding structure 6 is formed of the second light shielding layer 601 by using a patterning process, and the patterning process is, for example, a photolithography process, and the like. The second shielding structure 6 covers at least the second side surface 402 of the first shielding structure 4 that is away from the aperture 5 and includes a second opening 702 corresponding to the aperture 5. The second shielding structure 6 is light transmissive, and a refractive index of the second shielding structure 6 is greater than a refractive index of the first shielding structure 4 to constitute total reflection. Because the included angle γ between the tangent line of the second side surface 402 of the first shielding structure 4 and the plane where the aperture diaphragm 2 is located is an obtuse angle, which can enlarge an incident angle of light incident from the second shielding structure 6 onto the second side surface 402 of the first shielding structure 4, more light can be totally reflected on the second side surface 402 of the first shielding structure 4, as a result, the interference light entering the sensing unit through the aperture 5 is reduced, and the accuracy of the fingerprint identification device is increased. In this case, foregoing description may be referred to for the materials of the first shielding structure and the second shielding structure, which will not be repeated here.

Figure 7H:
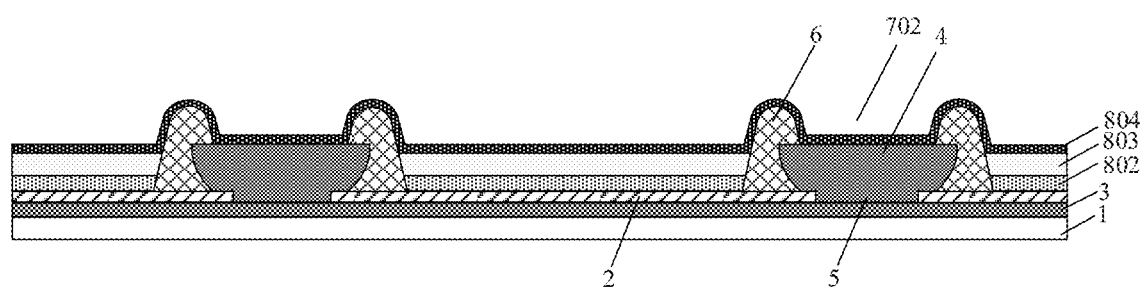

The fabrication method of the display panel further comprises: forming a display function component, for example, an organic light-emitting diode component, at least located in a display pixel unit 801. As illustrated in FIG. 7H, a first electrode 802, an organic light-emitting layer 803, and a second electrode 804 are sequentially formed, to form the organic light-emitting diode component. For example, the second electrode 804 is a common electrode covering the organic light-emitting layer 803, the first shielding structure 4, and the second shielding structure 6. The first electrode 802, the organic light-emitting layer 803, and the second electrode 804 may be formed by those skilled in the art by using conventional technologies in the art.

Figure 7I:
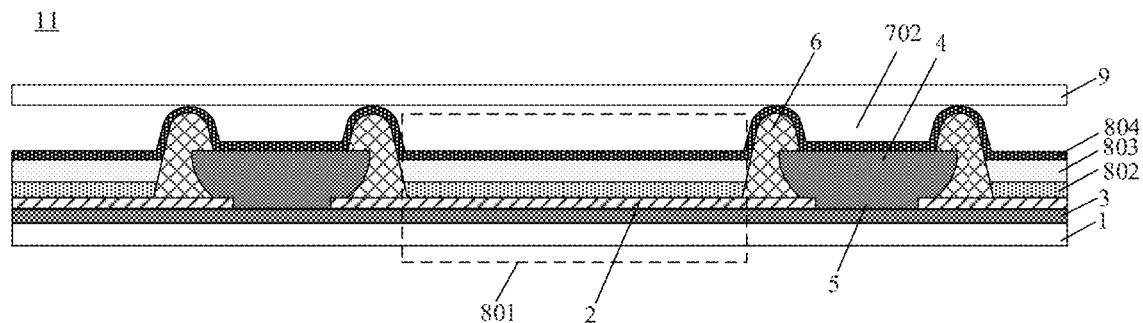

As illustrated in FIG. 7I, the organic light emitting device is encapsulated with an encapsulation layer 9, to obtain the display panel 11. For example, the encapsulation layer 9 may be a thin film encapsulation layer or an encapsulation cover plate. It should be noted that, a sealing filler or a sealant may further be used in the encapsulation process, which is not illustrated in the drawings of the embodiment of the present disclosure, and those skilled in the art may use a conventional technology.

In the display panel 11 formed by using the fabrication method provided by the embodiment of the present disclosure, the first shielding structure 4, the second shielding structure 6, and the aperture 5 are provided in a gap between pixel units 801. On the one hand, an aperture ratio of the display panel 11 is not affected; on the other hand, the first shielding structure 4 is further configured as a pixel defining layer for defining respective pixel units in the display pixel array, and the second shielding structure 6 is further configured as a spacer for supporting in the display pixel array; for example, the spacer is used for supporting the encapsulation layer 9, for example, the encapsulation layer 9 is the encapsulation cover plate. In this way, it is not necessary to additionally provide a pixel defining layer and a spacer, so that a structure of the display panel is simplified.

Figure 8A:
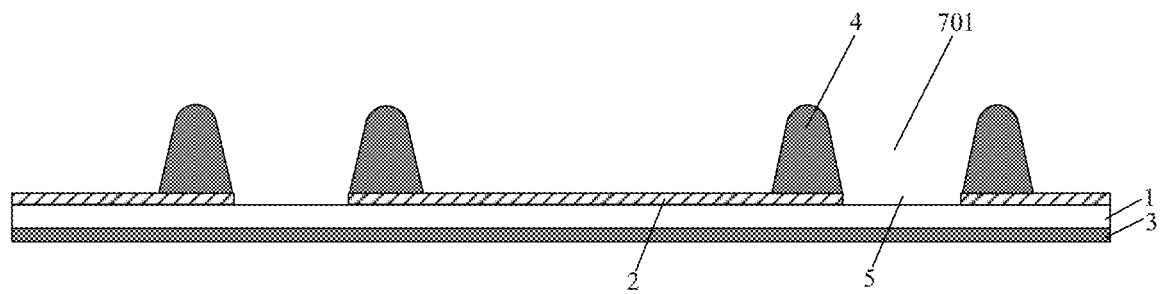
FIG. 8A to FIG. 8C are schematic diagrams of a fabrication method of another display panel provided by an embodiment of the present disclosure.
Figure 8B:
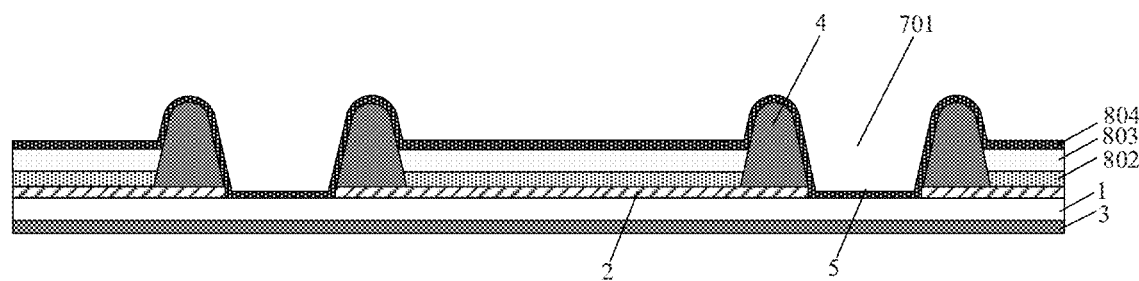
Figure 8C:
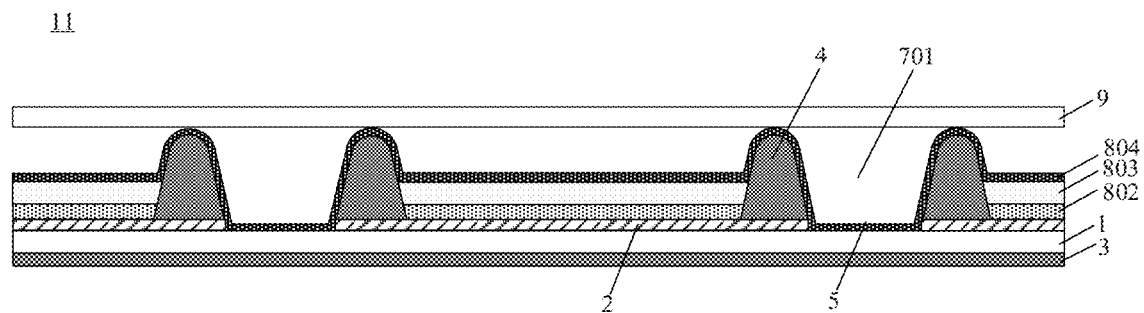

FIG. 8A to FIG. 8C are schematic diagrams of a fabrication method of another display panel provided by an embodiment of the present disclosure. The method differs from the method illustrated in FIG. 7A to FIG. 7I in that: as illustrated in FIG. 8A, after the processes illustrated in FIG. 7A to FIG. 7D are completed, the first light shielding layer 404 is patterned to form a first shielding structure 4 illustrated in FIG. 8A. The first shielding structure 4 surrounds an entire aperture 5 and includes a first opening 701 that exposes the aperture 5. In other embodiments of the present disclosure, a first shielding structure 4 may also partially surround an aperture 5, that is, the first shielding structure 4 surrounds a portion of a periphery of the aperture 5. For example, the first shielding structure 4 may be opaque or light transmissive. Because a part of the interference light is blocked by the opaque first shielding structure 4, interference light incident on the sensing unit 301 through the aperture 5 may be reduced, so as to increase accuracy of fingerprint identification by a fingerprint sensor. In this case, foregoing description may be referred to for a material of the first shielding structure.

As illustrated in FIG. 8B, a first electrode 802, an organic light-emitting layer 803, and a second electrode 804 which are at least located in a pixel unit 801 are sequentially formed. For example, the second electrode 804 is a common electrode covering the organic light-emitting layer 803, the first shielding structure 4, and the second shielding structure 6. The first electrode 802, the organic light-emitting layer 803, and the second electrode 804 may be formed by those skilled in the art by using conventional technologies in the art.

As illustrated in FIG. 8C, the organic light emitting device is encapsulated with an encapsulation layer 9, to obtain the display panel 11. For example, the encapsulation layer 9 may be a thin film encapsulation layer or an encapsulation cover plate. It should be noted that, a sealing filler or a sealant may further be used in the encapsulation process, which is not illustrated in the drawings of the embodiment of the present disclosure, and those skilled in the art may use a conventional technology. In the display panel 11 obtained by using the fabrication method illustrated in FIG. 8A to FIG. 8C, the second shielding structure 6 is further configured as a spacer for supporting in the display pixel array, so as to simplify a structure of the display panel.

Figure 9A:
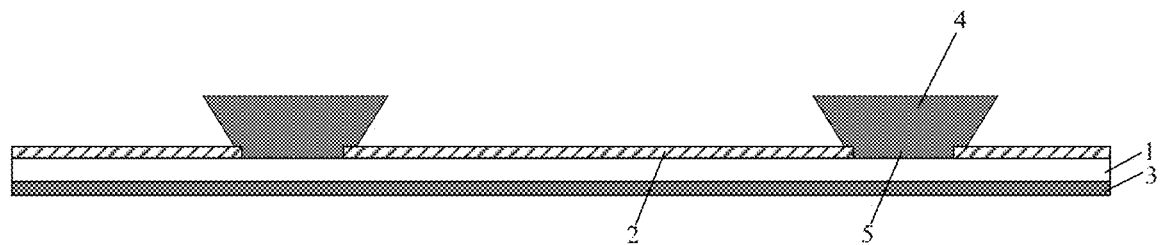
FIG. 9A to FIG. 9C are schematic diagrams of a fabrication method of still another display panel provided by an embodiment of the present disclosure.
Figure 9B:
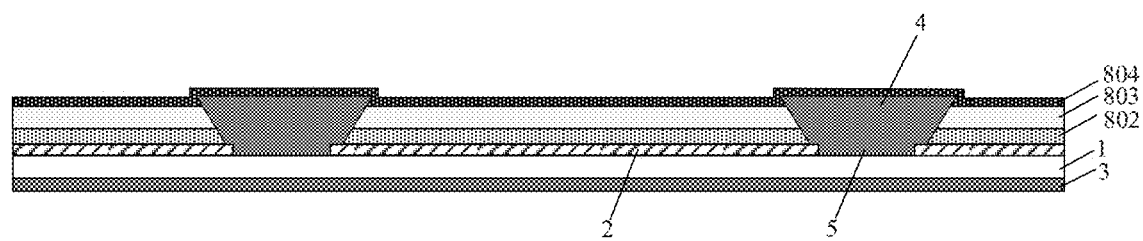
Figure 9C:
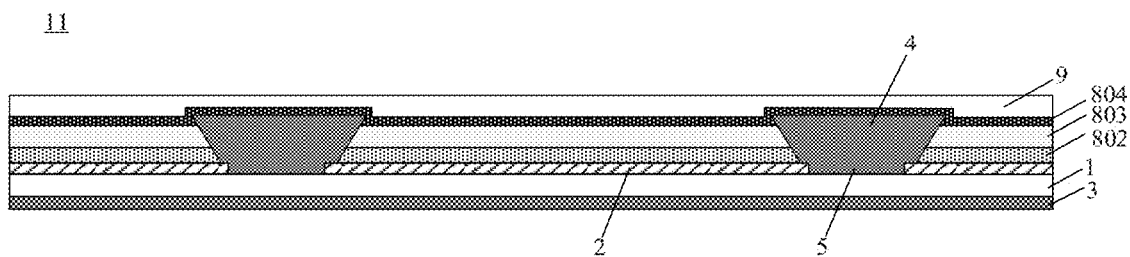

FIG. 9A to FIG. 9C are schematic diagrams of a fabrication method of still another display panel provided by an embodiment of the present disclosure. The method differs from the method illustrated in FIG. 7A to FIG. 7I in that: as illustrated in FIG. 9A, after the processes illustrated in FIG. 7A to FIG. 7D are completed, the first light shielding layer 404 is patterned to form a first shielding structure 4 illustrated in FIG. 9A. The first shielding structure 4 is light transmissive and includes a portion surrounding an aperture 5, and the first shielding structure 4 covers the aperture 5. When fingerprint identification is performed, light reflected by a finger is transmitted through the first shielding structure 4 to enter the aperture 5, and then is incident on a sensing unit of a sensor, to implement fingerprint identification. In this case, the portion of the first shielding structure 4 that surrounds the aperture 5 can play a role in blocking to reduce interference light incident on the sensing unit through the aperture 5, so as to increase accuracy of the fingerprint identification device.

As illustrated in FIG. 9B, a first electrode 802, an organic light-emitting layer 803, and a second electrode 804 which are at least located in a pixel unit 801 are sequentially formed. For example, the second electrode 804 is a common electrode covering the organic light-emitting layer 803, the first shielding structure 4, and the second shielding structure 6. The first electrode 802, the organic light-emitting layer 803, and the second electrode 804 may be formed by those skilled in the art by using conventional technologies in the art.

As illustrated in FIG. 9C, the organic light emitting device is encapsulated with an encapsulation layer 9, to obtain the display panel 11. For example, the encapsulation layer 9 may be a thin film encapsulation layer or an encapsulation cover plate. It should be noted that, a sealing filler or a sealant may further be used in the encapsulation process, which is not illustrated in the drawings of the embodiment of the present disclosure, and those skilled in the art may use a conventional technology. In the display panel 11 obtained by using the fabrication method illustrated in FIG. 9A to FIG. 9C, the first shielding structure 4 is further configured as a pixel defining layer for defining respective pixel units in the display pixel array, so as to simplify a structure of the display panel.

What is described above is related to the illustrative embodiments of the disclosure only and not limitative to the scope of the disclosure; the scopes of the disclosure are defined by the accompanying claims.

The invention claimed is:

1. A fingerprint identification device, comprising:
    a fingerprint sensor, comprising a plurality of sensing units;
    an aperture diaphragm on a light incident side of the fingerprint sensor, the aperture diaphragm comprising an aperture, the aperture being configured to allow light to be incident on at least one sensing unit of the plurality of sensing units through the aperture;
    a first shielding structure on a side of the aperture diaphragm facing away from the fingerprint sensor, the first shielding structure being configured to surround at least a portion of the aperture; and
    a second shielding structure, configured to cover at least a second side surface of the first shielding structure and comprising a second opening corresponding to the aperture, the second side surface of the first shielding structure being away from the aperture.

2. The fingerprint identification device according to claim 1, wherein the first shielding structure is configured to be light transmissive and comprises a first opening, the first opening is configured to expose the aperture; and
    an external angle between a first side surface of the first shielding structure and a plane where the aperture diaphragm is located is an obtuse angle, and the first side surface of the first shielding structure is close to the aperture.

3. The fingerprint identification device according to claim 1, wherein the first shielding structure is configured to be opaque and comprises a first opening, the first opening is configured to expose the aperture.

4. The fingerprint identification device according to claim 1, wherein the first shielding structure is configured to be light transmissive and to cover the aperture.

5. The fingerprint identification device according to claim 1, wherein the second shielding structure is configured to be light transmissive;
    an included angle between the second side surface of the first shielding structure or a tangent line of the second side surface and a plane where the aperture diaphragm is located is an obtuse angle; and
    a refractive index of the second shielding structure is greater than a refractive index of the first shielding structure.

6. The fingerprint identification device according to claim 5, wherein the second side surface of the first shielding structure is a convex surface, the convex surface is configured to protrude in a direction facing towards the second shielding structure, and an included angle between a tangent line of the convex surface and the plane where the aperture diaphragm is located is an obtuse angle.

7. The fingerprint identification device according to claim 1, wherein the aperture diaphragm comprises an opaque material.

8. The fingerprint identification device according to claim 1, wherein the first shielding structure is configured to reduce or block ambient light incident on the at least one sensing unit through the aperture.

9. A display panel, comprising the fingerprint identification device according to claim 1.

10. The display panel according to claim 9, further comprising:
a display pixel array, comprising a plurality of pixel units arranged in an array,
wherein both the first shielding structure and the aperture are in a gap between the plurality of pixel units.

11. The display panel according to claim 10, wherein the first shielding structure is further configured as a pixel defining layer for defining respective pixel units in the display pixel array.

12. The display panel according to claim 10, wherein the first shielding structure is further configured as a spacer for supporting in the display pixel array.

13. The display panel according to claim 12, wherein the second shielding structure is configured as a spacer for supporting in the display pixel array.

14. The display panel according to claim 10, wherein the display pixel array comprises a conductive layer located in at least the plurality of pixel units, the aperture diaphragm and the conductive layer are located in a same layer.

15. The display panel according to claim 9, further comprising: a base substrate, wherein the aperture diaphragm is on the base substrate, and the fingerprint sensor is located between the aperture diaphragm and the base substrate.

16. A display device, comprising the display panel according to claim 9.

17. A fabrication method of a display panel, comprising:
providing a fingerprint sensor, the fingerprint sensor comprising a plurality of sensing units;
forming an aperture diaphragm on a light incident side of the fingerprint sensor, the aperture diaphragm comprising an aperture;
forming a first shielding structure on a side of the aperture diaphragm facing away from the fingerprint sensor, the first shielding structure is configured to surround at least a portion of the aperture; and
forming a second shielding structure on the first shielding structure and the aperture diaphragm, the second shielding structure being configured to cover at least a second side surface of the first shielding structure and comprising a second opening corresponding to the aperture, the at least a second side surface of the first shielding structure being away from the aperture.

* * * * *